(12) United States Patent
Yow et al.

(10) Patent No.: US 9,437,492 B2
(45) Date of Patent: Sep. 6, 2016

(54) SUBSTRATE FOR ALTERNATIVE SEMICONDUCTOR DIE CONFIGURATIONS

(71) Applicants: Kai Yun Yow, Petaling Jaya (MY); Chee Seng Foong, Sg. Buloh (MY); Lan Chu Tan, Singapore (SG)

(72) Inventors: Kai Yun Yow, Petaling Jaya (MY); Chee Seng Foong, Sg. Buloh (MY); Lan Chu Tan, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 88 days.

(21) Appl. No.: 14/499,266

(22) Filed: Sep. 29, 2014

(65) Prior Publication Data
US 2016/0093533 A1    Mar. 31, 2016

(51) Int. Cl.

| | |
|---|---|
| H01L 23/48 | (2006.01) |
| H01L 23/52 | (2006.01) |
| H01L 29/40 | (2006.01) |
| H01L 21/78 | (2006.01) |
| H01L 23/00 | (2006.01) |
| H01L 23/544 | (2006.01) |
| H01L 21/56 | (2006.01) |
| H01L 23/31 | (2006.01) |

(52) U.S. Cl.
CPC ............ *H01L 21/78* (2013.01); *H01L 21/561* (2013.01); *H01L 23/544* (2013.01); *H01L 24/11* (2013.01); *H01L 24/85* (2013.01); *H01L 24/97* (2013.01); *H01L 23/3128* (2013.01); *H01L 2223/5442* (2013.01); *H01L 2223/54426* (2013.01); *H01L 2223/54453* (2013.01); *H01L 2223/54486* (2013.01); *H01L 2224/48091* (2013.01); *H01L 2224/49171* (2013.01); *H01L 2924/181* (2013.01)

(58) Field of Classification Search
CPC ... H01L 21/561; H01L 23/544; H01L 24/11; H01L 24/85; H01L 24/97
USPC .......................................................... 257/773
See application file for complete search history.

(56) References Cited

U.S. PATENT DOCUMENTS

| | | |
|---|---|---|
| 5,716,889 A | 2/1998 | Tsuji et al. |
| 5,777,392 A | 7/1998 | Fujii |
| 5,942,805 A | 8/1999 | Winer et al. |
| 6,111,756 A | 8/2000 | Moresco et al. |
| 6,638,831 B1 | 10/2003 | Roberts |
| 7,402,507 B2 | 7/2008 | Standing et al. |
| 7,898,095 B2 * | 3/2011 | Patti ................. H01L 21/76898 257/773 |
| 8,222,121 B2 * | 7/2012 | Patti ................. H01L 21/76898 257/774 |
| 2002/0058396 A1 * | 5/2002 | Roberts ................ H01L 23/544 438/460 |
| 2005/0205778 A1 * | 9/2005 | Kitai .................... B23K 26/032 250/309 |
| 2009/0001573 A1 * | 1/2009 | Jirawongsapiwat .... H01L 22/14 257/738 |
| 2009/0195768 A1 * | 8/2009 | Bijnen ................. G03F 9/7076 355/77 |

(Continued)

*Primary Examiner* — Jarrett Stark
*Assistant Examiner* — Charles N Ausar-El
(74) *Attorney, Agent, or Firm* — Charles E. Bergere

(57) ABSTRACT

A method of assembling semiconductor devices with semiconductor dies of alternative different configurations uses the same substrate panel. The dies of the selected configuration are placed in an array, mounted, and connected to internal electrical contact pads on a first face of the panel using main fiducial markings and an array of subsidiary fiducial markings corresponding universally to arrays of semiconductor dies of the different alternative configurations. The pitch of the subsidiary fiducial markings is equal to the spacing between adjacent rows of the internal electrical contact pads on the panel and is a sub-multiple of the pitch of the array of dies.

8 Claims, 4 Drawing Sheets

(56) References Cited

U.S. PATENT DOCUMENTS

| | | | | |
|---|---|---|---|---|
| 2013/0044206 A1* | 2/2013 | Liu | ........................ | H01L 21/681 348/87 |
| 2013/0052777 A1* | 2/2013 | Xu | ........................ | H01L 21/561 438/127 |
| 2013/0280826 A1* | 10/2013 | Scanlan | ................ | H01L 23/544 438/15 |
| 2014/0115886 A1* | 5/2014 | Sevigny | ................. | H05K 3/303 29/834 |
| 2015/0097203 A1* | 4/2015 | Imangholi | ............... | H01L 33/50 257/98 |
| 2015/0179584 A1* | 6/2015 | Woerz | .................... | H01L 22/12 257/797 |
| 2015/0311104 A1* | 10/2015 | Xu | ........................ | H01L 21/681 438/15 |

* cited by examiner

SUBSTRATE FOR ALTERNATIVE SEMICONDUCTOR DIE CONFIGURATIONS

BACKGROUND OF THE INVENTION

The present invention is directed to a semiconductor device assembly and, more particularly, to a substrate having fiducial markings for alternative semiconductor die configurations.

A common form of semiconductor device package has a semiconductor die mounted on a first face of a laminated substrate, and electrically connected to an array of internal electrical contacts on the first face of the substrate. The opposite, second face of the substrate has external electrical contacts for connection to external circuits, connected through the substrate to the internal contacts. The die is usually encapsulated in an electrically insulating material, such as epoxy molding compound.

Typically, during the packaging operation (commonly known as "assembly"), a substrate panel has a linear or two-dimension array of locations for semiconductor dies. Packaging operations, such as die placement and electrical connection of the dies to the internal contacts, are performed on the panel for the whole array of dies. Fiducial markings on the first face guide apparatus performing the packaging operations. The panel is then singulated to separate individual substrates with the dies. Encapsulation may also be performed before singulation.

Conventionally, a substrate panel is specific to a given configuration of semiconductor die, especially to its size and the number of its electrical contacts, and to the configuration of the finished semiconductor device, including the size and number of external electrical contacts of the substrate. These parameters affect the pitch of the array of semiconductor dies, and the fiducial markings used in the packaging operations. Using different, specific substrate panels limits the quantity of each variant of substrate panel, limiting economies of scale, increases the aggregate inventory of substrate panels, and increases costs.

A method of using the same substrate panel for packaging alternative different configurations of semiconductor dies is sought.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
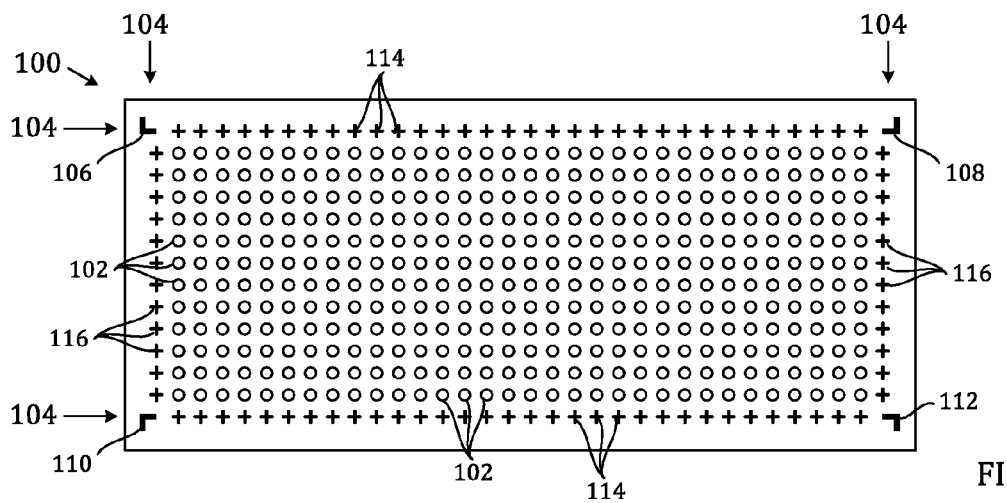
FIGS. 1 and 2 are schematic plan views of the upper face of a substrate panel used in packaging a semiconductor device in accordance with an embodiment of the invention, given by way of example.
Figure 2:
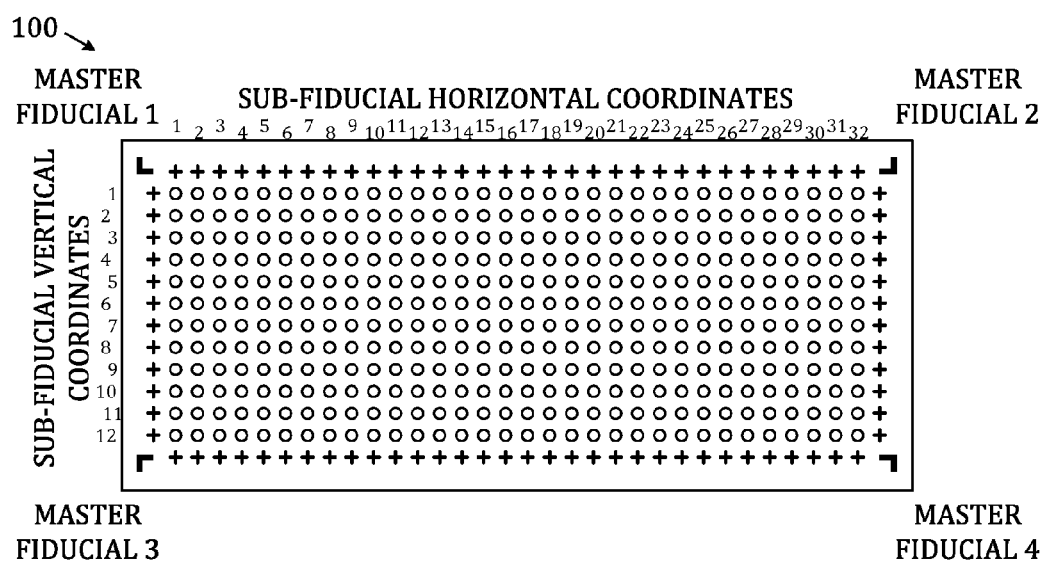
Figure 7:
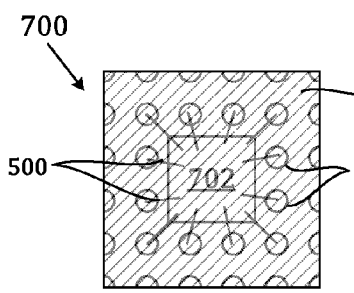
FIGS. 7 and 8 are respectively plan and sectional views of a semiconductor device singulated from the substrate panel of FIGS. 3 to 6.
Figure 8:
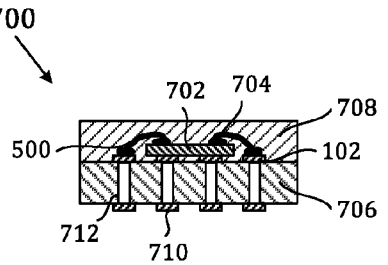
Figure 11:
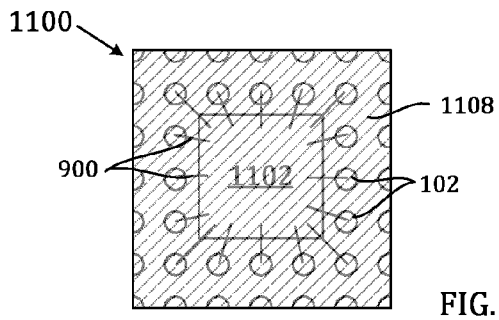
Figure 12:
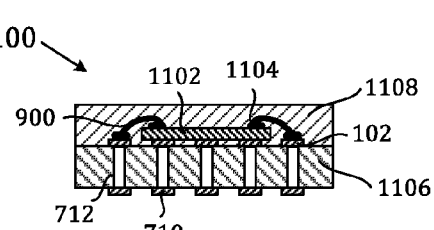

FIGS. 1 and 2 show a substrate panel 100 used in packaging a semiconductor device 700, 1100 (FIGS. 7 and 11) in accordance with an embodiment of the invention. The semiconductor device 700, 1100 has a semiconductor die 702, 1102 with electrical contact elements such as 704, 1104 on an active face of the die. The back face of the semiconductor die 702, 1102 is mounted on a substrate 706, 1106.

The dies 702 or 1102 and the substrates 706 or 1106 have different alternative configurations. The configurations differ in size and the number of electrical contact elements. In these examples, the die 702 has twelve active electrical contact elements 704, connected to a corresponding number of internal electrical contact elements 102 on a first face of the substrate 706, whereas the number of active electrical contact elements 1104 on the die 1102 and corresponding internal electrical contact elements 102 on the first face of the substrate 1106 is sixteen. It will be appreciated that other numbers of electrical contact elements are possible and often a semiconductor device has many more than twelve or sixteen electrical contact elements.

As illustrated in FIGS. 1 to 6, 9 and 10, the semiconductor devices 700 and 1100 are produced by a method comprising providing a substrate panel 100 having the internal electrical contact elements 102 on a first face for connection to the semiconductor dies 702, 1102. The first face is shown as the top face in examples illustrated in the drawings. Fiducial markings 104 on the first face are provided for guiding apparatus performing operations on the first face of the substrate panel. External electrical contact elements 710 are provided on a second face of the substrate panel 100, opposite the first face, for connection to external electrical circuits. The internal and external electrical contact elements 102, 710 are connected electrically through the substrate panel 100.

An array of semiconductor dies 702 or 1102 of the same configuration are placed and mounted on the first face of the substrate panel 100. The electrical contact elements 704 or 1104 are connected to the internal electrical contact elements 102 on the first face of the substrate panel 100. The substrate panel 100 with the semiconductor dies 102 is singulated. The placement, mounting, connection and singulation operations are performed by apparatus using the fiducial markings 104 for guidance. Conventionally, for different configurations of the semiconductor dies 702 and 1102 and of their arrays on the substrate panel 100, different substrate panels are used, with different, specific fiducial markings 104. Using different, specific substrate panels reduces the quantity of each variant of substrate panel, limiting economies of scale, increases the aggregate inventory of substrate panels, and increases costs.

FIGS. 1 to 6, 9 and 10 illustrate a method in accordance with an embodiment of the invention, in which the semiconductor devices 700 and 1100 with semiconductor dies 702, 1102 of alternative different configurations are assembled using the same substrate panel 100. The fiducial markings 104 include main fiducial markings 106 to 112 and an array of subsidiary fiducial markings such as 114 and 116 corresponding to arrays of semiconductor dies of the different alternative configurations.

FIG. 1 illustrates a substrate panel 100 for use in producing semiconductor devices 700, 1100 with semiconductor dies 702, 1102 of alternative configurations. The substrate panel has the internal electrical contact elements 102 on a first face for connection to the semiconductor dies 702, 1102. Fiducial markings 104 on the first face are provided for guiding apparatus performing operations of placing and mounting an array of semiconductor dies 702, 1102 of a selected configuration on the first face of the substrate panel 100, connecting electrically the internal electrical contact elements 102 of the substrate panel 100 with electrical contact elements 704, 1104 of the semiconductor dies 702, 1102, and singulating the substrate panel with the semiconductor dies 702, 1102. External electrical contact elements 710 are provided on a second face of the substrate panel 100, opposite the first face, for connection to external electrical circuits. The internal and external electrical contact elements 102, 710 are connected electrically through the substrate panel 100. The fiducial markings 104 include main fiducial markings 106 to 112 and an array of subsidiary fiducial markings such as 114 and 116 corresponding to arrays of semiconductor dies of the different alternative configurations.

The array of semiconductor dies 702, 1102 and the array of subsidiary fiducial markings 114, 116 may extend in two orthogonal dimensions. The array of subsidiary fiducial markings 114, 116 includes subsidiary fiducial markings corresponding to arrays of semiconductor dies of the alternative configurations in both the orthogonal dimensions.

The subsidiary fiducial markings 114, 116 may have a pitch which is a sub-multiple of a pitch of the arrays of semiconductor dies 702, 1102 of all the alternative configurations. In the example shown in FIGS. 1 to 12, the pitch of the subsidiary fiducial markings 114, 116 is one-fifth the pitch of the array of semiconductor dies 702 and is one-sixth the pitch of the array of semiconductor dies 1102. The internal electrical contact elements 102 of the substrate panel 100 are disposed in orthogonal rows, and adjacent rows of the internal electrical contact elements 102 of the substrate panel have a spacing equal to the pitch of the subsidiary fiducial markings 114, 116. In the example shown in FIGS. 1 to 12, the size of the semiconductor dies 702 is equal to three times, but the size of the semiconductor dies 1102 is equal to four times, the spacing between adjacent rows of the internal electrical contact elements 102 of the substrate panel.

The internal electrical contact elements 102 on the first face of the substrate panel 100 and the external electrical contact elements 710 on the second face of the substrate panel are aligned and are connected through the substrate panel by respective vias such as 712. In this example, the vias 712 are plated through holes (PTHs). If the fiducial markings are made first, the PTHs can be drilled using the subsidiary fiducial markings 114, 116 as coordinates.

Figure 13:
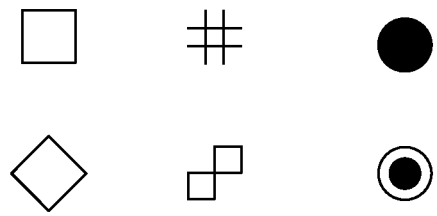
FIG. 13 is a schematic plan view of variations of fiducial markings that are usable on the substrate panel.

The shape of the subsidiary fiducial markings 114, 116 may be distinguishable by vision algorithms from the shape of the main fiducial markings 106 to 112. Using the subsidiary fiducial markings 114, 116 may include coarse positioning using the main fiducial markings 106 to 112 and fine positioning using the subsidiary fiducial markings 114, 116. In the substrate panel 100, the main fiducial markings 106 to 112 are L-shaped, and the subsidiary fiducial markings 114, 116 are cross-shaped. Other examples of shapes that are distinguishable by vision algorithms are illustrated in FIG. 13.

Connecting electrically the contact elements may include attaching bond wires such as 500, 900 to the internal electrical contact elements 102 of the substrate panel 100 and the electrical contact elements 704, 1104 of the semiconductor dies 702, 1102. Attaching the bond wires 500, 900 to the internal electrical contact elements 102 of the substrate panel 100 and the electrical contact elements 704, 1104 of the semiconductor dies 702, 1102 may use the subsidiary fiducial markings 114, 116.

Before singulating the substrate panel 100, the array of semiconductor dies 702, 1102 may be encapsulated in a molding compound 708, 1108, identified by hatched lines in FIGS. 6 to 8 and 10 to 12, but shown as if it were transparent.

An array of solder balls (not shown) may be attached to the external electrical contact elements 710 on the second face of the substrate panel 100 before singulating the substrate panel. The resulting semiconductor device 700, 1100 can be a ball grid array (BGA) package or a mold array process (MAP BGA) package.

In more detail, as shown in FIG. 1, the main fiducial markings 106 to 112 are situated at the four corners of the substrate panel 100. The internal contact elements 102 on the first face of the substrate panel are bond pads positioned in orthogonal rows in a two-dimensional array. The subsidiary fiducial markings 114 are positioned in horizontal rows (as seen in FIGS. 1 to 6, 9 and 10) and the subsidiary fiducial markings 116 are positioned in vertical rows. The subsidiary fiducial markings 114, 116 are aligned with the rows of the internal contact elements 102 and adjacent markings 114, 116 have the same spacing as adjacent rows of the internal contact elements 102. The semiconductor dies 702, 1102 of the arrays mounted on the substrate panel 100 will be spaced by an integral number of rows of the internal contact elements 102, so that the subsidiary fiducial markings 114, 116 can guide operations on any feasible array of different configurations of semiconductor dies 702, 1102. However, patterns of subsidiary fiducial markings 114, 116 can be used which suit various different configurations of semiconductor dies 702, 1102, without necessarily being as universal as the pattern shown in FIG. 1. It will be appreciated that the sizes, positions, patterns and shapes of the main fiducial markings 106 to 112 and of the subsidiary fiducial markings 114, 116 are examples and other suitable configurations can be used. In particular, the main fiducial markings 106 to 112, are not necessarily positioned at the corners of the substrate panel 100.

Figure 3:
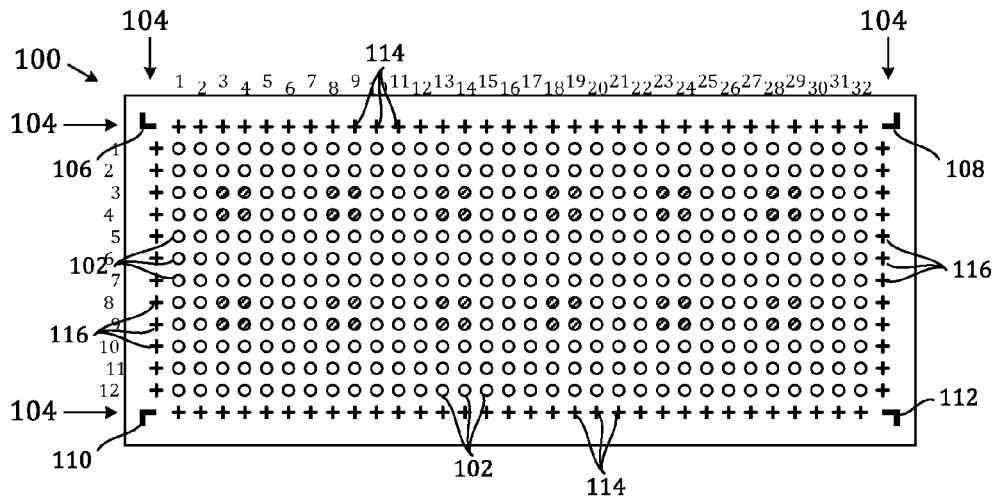
FIGS. 3 to 6 are schematic plan views of the upper face of the substrate panel of FIGS. 1 and 2 during a method of packaging a semiconductor device with a first configuration of semiconductor die in accordance with an embodiment of the invention.

For guiding operations on the array of dies 702, 1102, such as placement, mounting, connection and singulation, the apparatus performs a vision algorithm. As illustrated in FIGS. 2 and 3, the apparatus locates optically the first master fiducial marking 106, then the second master fiducial marking 108 and allocates horizontal coordinates to each of the subsidiary fiducial markings 114 between them. The apparatus then locates optically the third master fiducial marking 110 and allocates vertical coordinates to each of the subsidiary fiducial markings 116 between the first and third master fiducial markings 106 and 110. The process may be repeated for the horizontal coordinates of the subsidiary fiducial markings 114 between the third and fourth master fiducial markings 110 and 112, and for the vertical coordinates of the subsidiary fiducial markings 116 between the second and fourth master fiducial markings 108 and 112.

Figure 4:
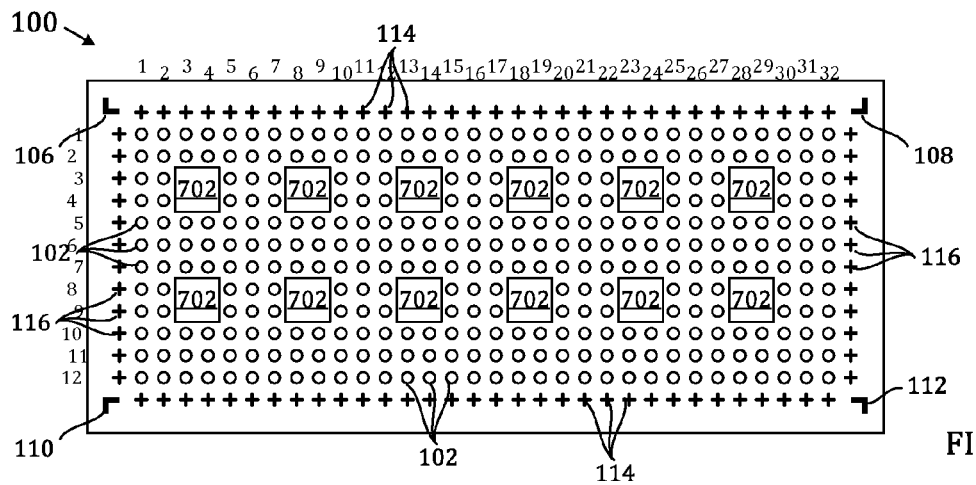
Figure 5:
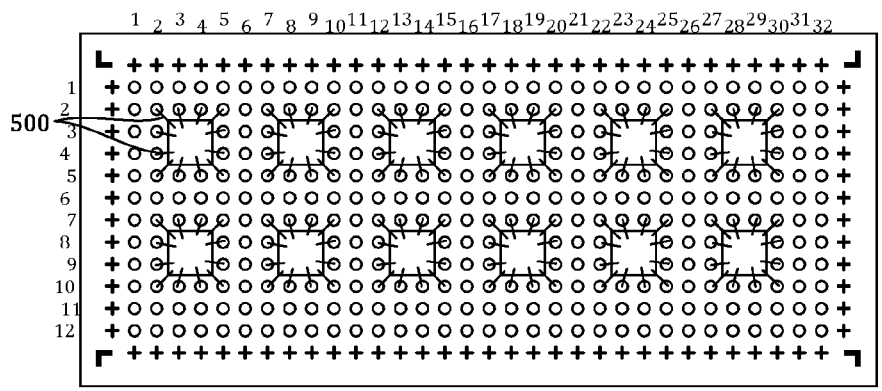
Figure 9:
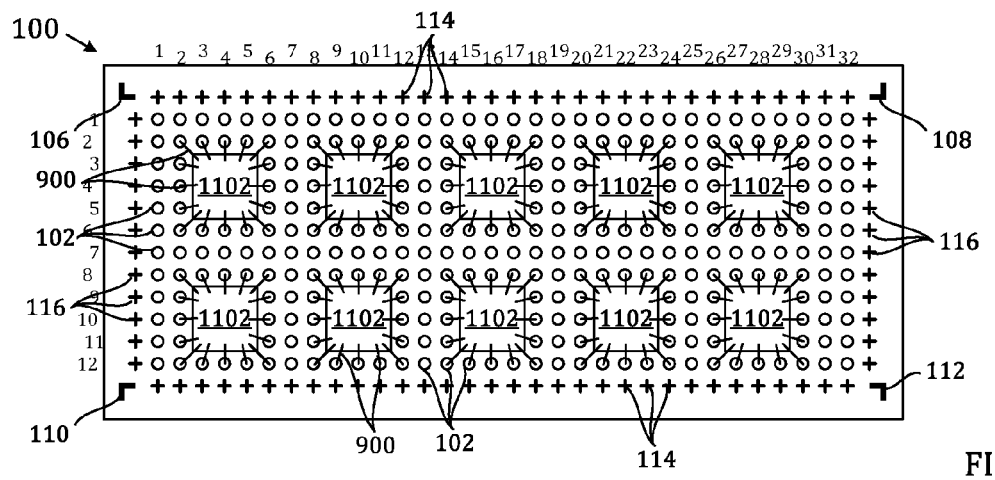
FIGS. 9 to 12 are views similar to FIGS. 5 to 8 during a method of packaging a different semiconductor device with a second configuration of semiconductor die in accordance with an embodiment of the invention.

As illustrated in FIG. 3, the allocated coordinates enable the apparatus to identify the positions of all the PTH internal electrical contact elements 102 (shown hatched) of the substrate panel 100 corresponding to semiconductor dies of the array to be placed (in this case the semiconductor dies 702). FIG. 4 shows the semiconductor dies 702 placed in the array. FIG. 5 shows the wire bonding operation for the semiconductor dies 702, and by way of comparison, FIG. 9 shows the wire bonding operation for the semiconductor dies 1102, which are of a larger die size than the semiconductor dies 702, and with a greater number of electrical contact elements 1104 than the electrical contact elements 704. In each case, the allocated coordinates established by the subsidiary fiducial markings 114, 116 guide the attachment of the bond wires to the relevant internal electrical contact elements 102 of the substrate panel 100. If the placement of the dies 702 and 1102 are sufficiently precise, the subsidiary fiducial markings 114, 116 can be used to guide the bonding operations on the electrical contact elements 704 and 1104 on the dies. If the dies 702 and 1102 bear their own fiducial markings, these may be used on their own to guide the bonding operations on the electrical contact elements 704 and 1104 on the dies, or the vision algorithm can use a combination of the fiducial markings on the dies 702 and 1102 together with the subsidiary fiducial markings 114, 116 on the substrate panel 100.

Figure 6:
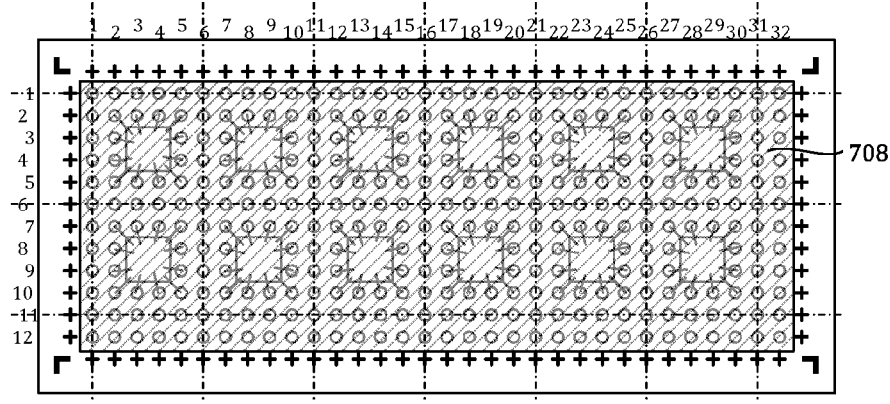
Figure 10:
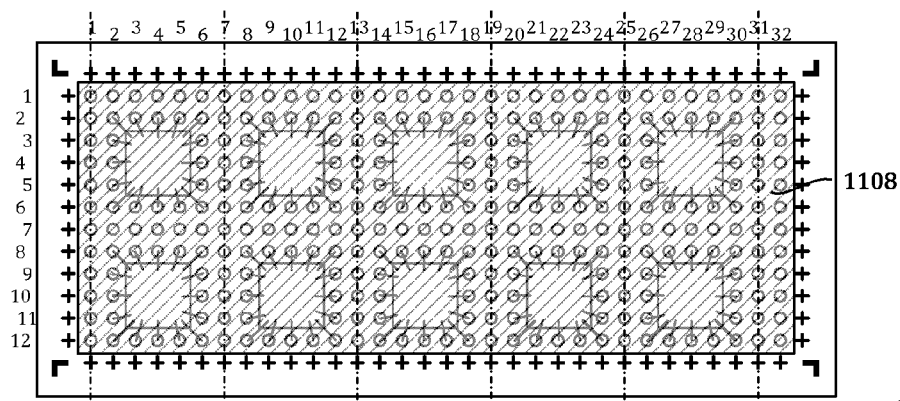

As shown in FIGS. 6 and 10, the array of dies 702, 1102 is encapsulated in molding compound 708, 1108 on the substrate panel 100, leaving the fiducial markings 106 to 112 and 114, 116 visible to guide singulation of the substrate panel 100, along saw streets indicated by chain-dotted lines.

Figure 14:
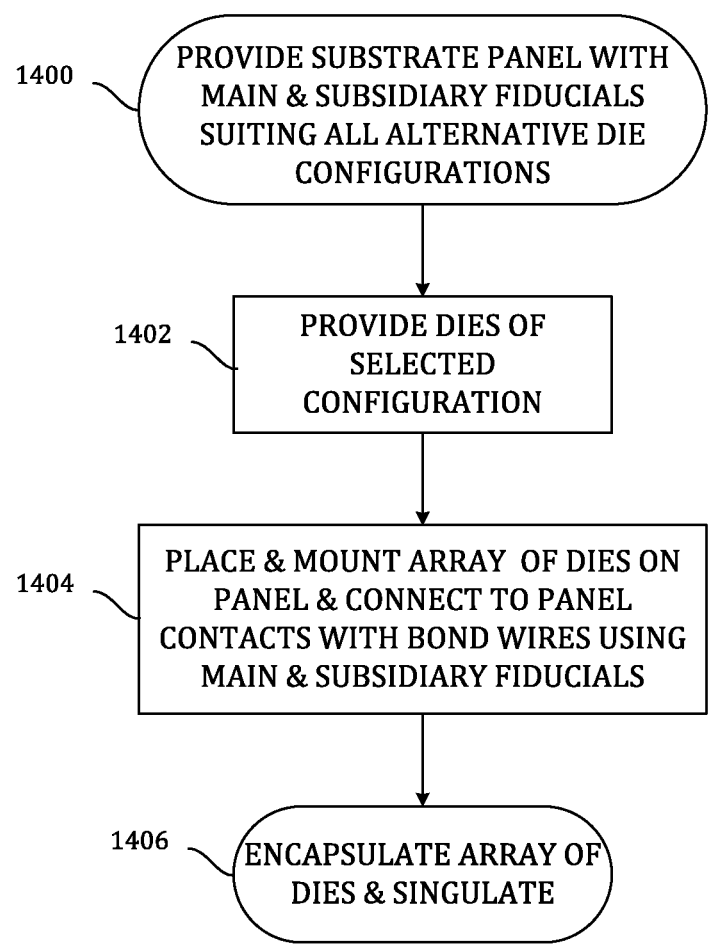
FIG. 14 is a flow chart of a method of producing semiconductor devices in accordance with an embodiment of the invention.

FIG. 14 summarizes the method shown in FIGS. 1 to 12. In a step 1400, a substrate panel 100 is provided having main and subsidiary fiducial markings 106 to 112 and 114 and 116 that suit all the alternative different die configurations 702, 1102 that are to be used in the range of semiconductor devices 700, 1100. At 1402, dies 702 or 1102 are provided having a configuration which is selected from among the alternative configurations.

The dies are placed and mounted on the substrate panel 100 at 1404, and the internal electrical contact elements 102 of the substrate panel 100 are connected electrically with the electrical contact elements 704 or 1104 of the semiconductor dies 702 or 1102 with bond wires. The placement, mounting and connection operations are guided using the main and subsidiary fiducial markings 106 to 112 and 114 and 116. At 1406, the dies 702 or 1102 are encapsulated with a molding compound 708, 1108 applied to the first face of the substrate panel, leaving visible the fiducial markings 106 to 112 and 114 and 116, and the substrate panel is singulated, using the fiducial markings.

The invention may also be implemented partially in a non-transitory machine-readable medium containing a computer program for running on a computer system, the program at least including code portions for performing steps of a method according to the invention when run on a programmable apparatus, such as a computer system or enabling a programmable apparatus to perform functions of a device or system according to the invention. The computer program may be stored internally on computer readable storage medium or transmitted to the computer system via a computer readable transmission medium.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

In the foregoing specification, the invention has been described with reference to specific examples of embodiments of the invention. It will, however, be evident that various modifications and changes may be made therein without departing from the broader spirit and scope of the invention as set forth in the appended claims.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of assembling semiconductor devices with semiconductor dies of alternative configurations, the method comprising:

providing a substrate panel having an array of internal electrical contact elements on a first face for connection to the semiconductor dies, fiducial markings on the first face for guiding apparatus performing operations on the first face of the substrate panel, and an array of external electrical contact elements on a second face, opposite the first face, for connection to external electrical circuitry, wherein the internal and external electrical contact elements are aligned and electrically connected through the substrate panel by respective vias;

placing and mounting an array of semiconductor dies of a selected configuration on the first face of the substrate panel using the fiducial markings, each of the semiconductor dies having bonding pads;

electrically connecting the internal electrical contact elements of the substrate panel with the bonding pads of the semiconductor dies; and singulating the substrate panel with the semiconductor dies using the fiducial markings;

wherein the fiducial markings include main fiducial markings located proximate to an outer perimeter of the substrate panel and at corners thereof, and an array of subsidiary fiducial markings corresponding to arrays of semiconductor dies of the different alternative configurations, wherein the array of subsidiary fiducial markings extends in two orthogonal dimensions and has a pitch that is a sub-multiple of a pitch of the arrays of semiconductor dies of different alternative configurations, and wherein the internal electrical contact elements are disposed in orthogonal rows, and adjacent rows thereof have a spacing equal to the pitch of the subsidiary fiducial markings.

2. The method of claim 1, wherein the shape of the subsidiary fiducial markings is distinguishable by vision algorithms from the shape of the main fiducial markings.

3. The method of claim 2, wherein using the subsidiary fiducial markings includes coarse positioning using the main fiducial markings and fine positioning using the subsidiary fiducial markings.

4. The method of claim 1, wherein electrically connecting the contact elements includes attaching bond wires to the internal electrical contact elements of the substrate panel and the bonding pads of the semiconductor dies using the subsidiary fiducial markings.

5. The method of claim 1, wherein the array of semiconductor dies is encapsulated in a molding compound before singulating the substrate panel.

6. The method of claim 5, wherein an array of solder balls is attached to the external electrical contact elements on the second face of the substrate panel before singulating the substrate panel.

7. A substrate panel for use in assembling semiconductor devices with semiconductor dies of alternative configurations, the substrate panel comprising:

an array of internal electrical contact elements on a first face for connection to the semiconductor dies;

fiducial markings on the first face for guiding apparatus performing operations of placing and mounting an array of semiconductor dies of a selected configuration on the first face of the substrate panel, electrically connecting the internal electrical contact elements of the substrate panel with bonding pads of the semiconductor dies, and singulating the substrate panel with the semiconductor dies; and an array of external electrical contact elements on a second face, opposite the first face, for connection to external electrical circuitry, wherein the internal and external electrical contact elements are aligned and electrically connected through the substrate panel by respective vias, wherein the fiducial markings include main fiducial markings located proximate to an outer perimeter of the substrate panel and at corners thereof, and an array of subsidiary fiducial markings corresponding to arrays of semiconductor dies of different alternative configurations of semiconductor dies, wherein the array of subsidiary fiducial markings extends in two orthogonal dimensions and the subsidiary fiducial markings have a pitch that is a sub-multiple of a pitch of the arrays of semiconductor dies of different alternative configurations, and wherein the internal electrical contact elements of the substrate panel are disposed in orthogonal rows, and adjacent rows thereof have a spacing equal to the pitch of the subsidiary fiducial markings.

8. The substrate panel of claim 7, wherein the shape of the subsidiary fiducial markings is distinguishable by vision algorithms from the shape of the main fiducial markings.

* * * * *